United States Patent
Asada et al.

(10) Patent No.: US 11,188,058 B2
(45) Date of Patent: Nov. 30, 2021

(54) ADJUSTING METHOD FOR IMPRINT APPARATUS, IMPRINTING METHOD, AND ARTICLE MANUFACTURING METHOD

(71) Applicant: CANON KABUSHIKI KAISHA, Tokyo (JP)

(72) Inventors: Kunihiko Asada, Utsunomiya (JP); Shingo Ishida, Utsunomiya (JP); Kenta Sasa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 148 days.

(21) Appl. No.: 15/384,756

(22) Filed: Dec. 20, 2016

(65) Prior Publication Data
US 2017/0185074 A1 Jun. 29, 2017

(30) Foreign Application Priority Data
Dec. 25, 2015 (JP) .............................. JP2015-254871

(51) Int. Cl.
*G05B 19/418* (2006.01)
*G03F 7/00* (2006.01)
(Continued)

(52) U.S. Cl.
CPC .......... *G05B 19/418* (2013.01); *B05D 3/06* (2013.01); *B05D 3/12* (2013.01); *G03F 7/0002* (2013.01);
(Continued)

(58) Field of Classification Search
None
See application file for complete search history.

(56) References Cited

U.S. PATENT DOCUMENTS

| 7,295,288 B1 * | 11/2007 | Subramanian | B82Y 10/00 |
| | | | 101/368 |
| 2010/0112116 A1 * | 5/2010 | Choi | B82Y 10/00 |
| | | | 425/385 |

(Continued)

FOREIGN PATENT DOCUMENTS

| CN | 102866582 B | 9/2014 |
| CN | 102640574 B | 4/2015 |

(Continued)

OTHER PUBLICATIONS

Jing Chen. Soft UV nanoimprint lithography : a versatile technique for the fabrication of plasmonic biosensors. Université Paris Sud—Paris XI, 2011., 2011.*

(Continued)

*Primary Examiner* — James M Mellott
(74) *Attorney, Agent, or Firm* — Canon U.S.A., Inc. IP Division

(57) ABSTRACT

An adjusting method for adjusting an imprint apparatus includes a preparation step of preparing a sample for evaluating a state in which a contact region of a test mold is in contact with an imprint material supplied on a substrate; an evaluation step of evaluating the sample; and an adjustment step of adjusting the imprint apparatus based on a result of evaluation obtained in the evaluation step. The contact region includes a flat region which does not include a pattern, the evaluation in the evaluation step includes a first evaluation, which is an evaluation of a state of the imprint material in the flat region, and the imprint apparatus is adjusted based on a result of the first evaluation in the adjustment step.

21 Claims, 9 Drawing Sheets

(51) Int. Cl.
  *G03F 9/00* (2006.01)
  *B05D 3/06* (2006.01)
  *B05D 3/12* (2006.01)
(52) U.S. Cl.
  CPC ..... *G03F 9/7042* (2013.01); *G05B 19/41875* (2013.01); *G05B 2219/32182* (2013.01); *G05B 2219/45031* (2013.01); *Y02P 90/02* (2015.11)

(56) References Cited

U.S. PATENT DOCUMENTS

| | | | | |
|---|---|---|---|---|
| 2010/0314798 | A1* | 12/2010 | Kawakami | B82Y 10/00 264/293 |
| 2011/0042352 | A1* | 2/2011 | Okushima | B82Y 10/00 216/44 |
| 2013/0026674 | A1* | 1/2013 | Wakamatsu | B29C 33/3857 264/219 |
| 2015/0076724 | A1 | 3/2015 | Sato | |
| 2015/0224703 | A1* | 8/2015 | Oda | G03F 7/0002 264/447 |

FOREIGN PATENT DOCUMENTS

| | | |
|---|---|---|
| GN | 101930183 A | 12/2010 |
| GN | 102929099 A | 2/2013 |
| GN | 104170055 A | 11/2014 |
| JP | 2005-026462 A | 1/2005 |
| JP | 2010-214913 A | 9/2010 |
| JP | 2010-225693 A | 10/2010 |
| JP | 2011-29538 A | 2/2011 |
| JP | 2012-64810 A | 3/2012 |
| JP | 2012-506635 A | 3/2012 |
| JP | 2012-507140 A | 3/2012 |
| JP | 2014-241398 A | 12/2014 |
| JP | 2015-28978 A | 2/2015 |
| JP | 2015-056589 A | 3/2015 |
| TW | 200744829 A | 12/2007 |

OTHER PUBLICATIONS

Hsu, et al., A method for in situ measurement of residual layer thickness in nano-imprint lithography, Microelectronic Engineering 110 (2013) 132-140.*

Jing Chen et al.; "A versatile pattern inversion process based on thermal and soft UV nanoimprint lithography techniques;" Microelectronic Engineering 87; Dec. 11, 2009; pp. 899-903.

* cited by examiner

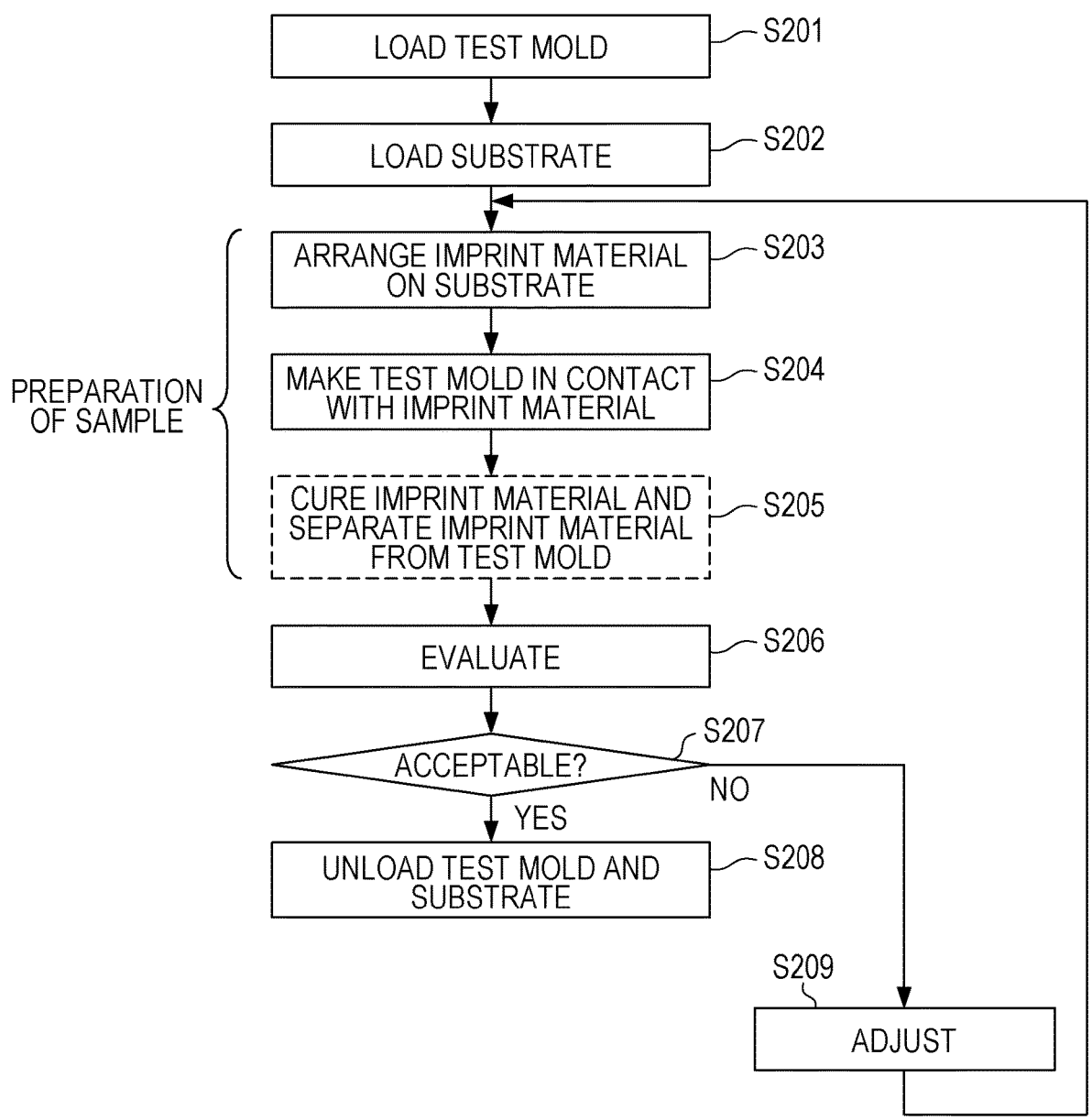

ADJUSTING METHOD FOR IMPRINT APPARATUS, IMPRINTING METHOD, AND ARTICLE MANUFACTURING METHOD

BACKGROUND OF THE INVENTION

Field of the Invention

The present disclosure generally relates to an adjusting method for an imprint apparatus, an imprinting method, and an article manufacturing method.

Description of the Related Art

An imprint technique is a technique for arranging an imprint material on a substrate, shaping the imprint material using a mold, and then curing the imprint material to transfer a pattern of the mold to the imprint material. Shaping the imprint material is performed by making the mold in contact with the imprint material to fill the imprint material in a concave part configuring the pattern of the mold by a capillary phenomenon. To form a pattern without any defects on a substrate by the imprint technique, an imprint apparatus needs to be adjusted. Hereinafter, forming a pattern on a substrate by the imprint technique will be referred to as imprinting. Adjustment of an imprint apparatus may include, for example, adjustment of conditions for imprinting in the imprint apparatus, maintenance of the imprint apparatus, and the like.

Providing conditions for machining parameters in imprinting is described in Japanese Patent Laid-Open No. 2005-026462. Machining parameters include pressing force of a mold with respect to a wafer, temperature of the mold, temperature of the wafer, and the like.

Adjustment of an imprint apparatus has been made by performing imprinting using a mold in which a pattern to be transferred to an imprint material on a substrate is formed (hereinafter, referred to as a "pattern mold" or simply referred to as a "mold"). However, in imprinting for the adjustment, if the pressing force with respect to the substrate is strong or a particle is present between the substrate and the mold, the mold may be deteriorated or damaged. Pattern molds are very expensive. Therefore, deterioration or damage to the pattern mold should be avoided in adjustment of the imprint apparatus.

SUMMARY OF THE INVENTION

According to an aspect of the present disclosure, an adjusting method for adjusting an imprint apparatus includes a preparation step of preparing a sample for evaluating a state in which a contact region of a test mold is in contact with an imprint material supplied on a substrate; an evaluation step of evaluating the sample; and an adjustment step of adjusting the imprint apparatus based on a result of evaluation obtained in the evaluation step. The contact region includes a flat region which does not include a pattern, the evaluation in the evaluation step includes a first evaluation, which is an evaluation of a state of the imprint material in the flat region, and the imprint apparatus is adjusted based on a result of the first evaluation in the adjustment step.

Further features of the present disclosure will become apparent from the following description of exemplary embodiments with reference to the attached drawings.

BRIEF DESCRIPTION OF THE DRAWINGS

FIG. 2 is a diagram illustrating an example of an adjusting method for an imprint apparatus.

DESCRIPTION OF THE EMBODIMENTS

Hereinafter, exemplary embodiments of the present disclosure will be described with reference to attached drawings.

Figure 1:
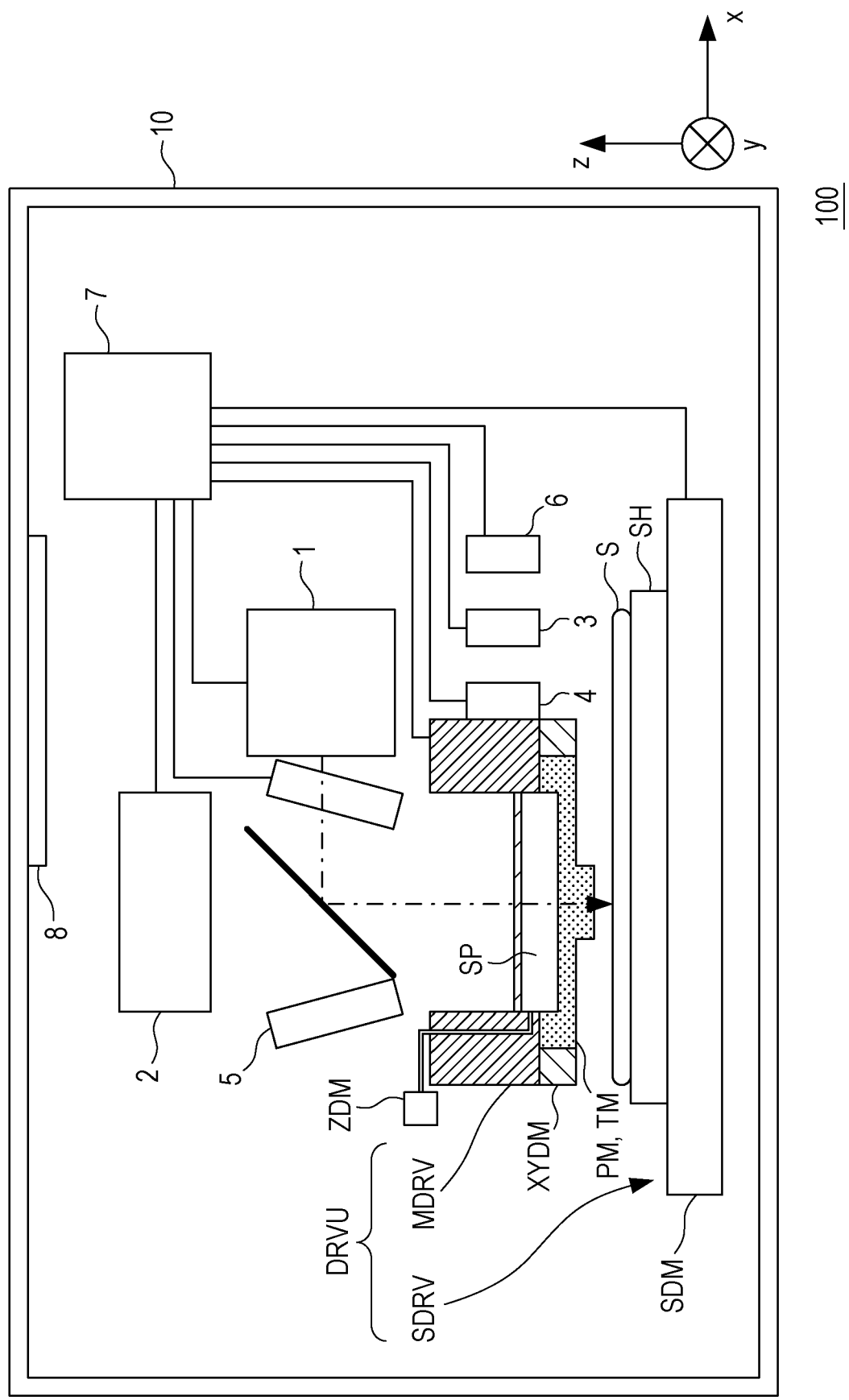
FIG. 1 is a diagram schematically illustrating a configuration of an imprint apparatus.

FIG. 1 schematically illustrates a configuration of an imprint apparatus 100 according to an embodiment of the present disclosure. The imprint apparatus 100 shapes an imprint material supplied on a substrate S using a mold (pattern mold) PM, and forms a pattern on the substrate S by curing the shaped imprint material. The imprint material is a curable composition which is cured by being provided with energy for curing the material. An imprint material may be in a cured state or an uncured state. Energy for curing may be, for example, electromagnetic waves, heat, or the like. For example, electromagnetic waves may be light (for example, infrared light, visible light, or ultraviolet light) whose wavelength is selected within a range from equal to or more than 10 nanometers to less than or equal to 1 millimeters.

Typically, curable compositions are cured by application of light or heating. Photocurable compositions which are cured by light may contain at least a polymerizable compound and a photopolymerization initiator. Furthermore, photocurable compositions may additionally contain a non-polymerizable compound or a solvent. Non-polymerizable compounds may be of at least one type selected from a group of, for example, a sensitizer, a hydrogen donor, an internally added release agent, a surface active agent, an antioxidant, a polymer component, and the like.

In the description and attached drawings, directions are indicated on an XYZ coordinate system in which the direction parallel to the surface of the substrate S is defined as an XY plane. Directions parallel to an X axis, a Y axis, and a Z axis in the XYZ coordinate system are represented by an X direction, a Y direction, and a Z direction, respectively. Rotation around the X axis, rotation around the Y axis, and rotation around the Z axis are represented by θX, θY, and θZ, respectively. Control or driving on the X axis, the Y axis, and the Z axis represent control or driving on a direction parallel to the X axis, a direction parallel to the Y axis, and a direction parallel to the Z axis, respectively. Furthermore, control or driving on the θX axis, the θY axis, and the θZ axis represent control or driving on rotation around the axis parallel to the X axis, rotation around the axis parallel to the Y axis, and rotation on the axis parallel to the Z axis, respectively. Furthermore, a position is information which may be identified based on coordinates on the X axis, the Y axis, and the Z axis, and an orientation is information which may be identified by relative rotation with respect to the θX axis, the θY axis, and the θZ axis. Positioning represents controlling a position and/or orientation.

The imprint apparatus 100 may include a driving unit DRVU, a curing unit 1, an image pickup unit 2, a dispenser (imprint material supply unit) 3, a purge gas supply unit 4, an alignment scope 5, an inspection unit 6, a control unit 7, a filter 8, and a chamber 10. The driving unit DRVU, the curing unit 1, the image pickup unit 2, the dispenser 3, the purge gas supply unit 4, the alignment scope 5, and the inspection unit 6 are arranged within the chamber 10. Air may be supplied to the internal space of the chamber 10 through the filter 8.

The driving unit DRVU drives at least one of the substrate S and the mold PM such that the relative position of the substrate S and the mold PM may be adjusted. The driving unit DRVU may include, for example, a substrate driving part SDRV for positioning of the substrate S and a mold driving part MDRV for positioning of the mold PM. For example, the substrate driving part SDRV includes a substrate holder SH which holds the substrate S and a driving mechanism SDM for driving the substrate holder SH, and the driving mechanism SDM drives the substrate holder SH such that the substrate S may be driven around multiple axes (for example, three axis including the X axis, the Y axis, and the Z axis). Furthermore, the mold driving part MDRV includes a mold holder and a driving mechanism for driving the mold holder, and the driving mechanism drives the mold PM around multiple axes (for example, six axes including the X axis, the Y axis, the Z axis, the θX axis, the θY axis, and the θZ axis). The driving unit DRVU adjusts the relative position of the substrate S and the mold PM with respect to the X axis, the Y axis, the θX axis, the θY axis, and the θZ axis, and also adjusts the relative position of the substrate S and the mold PM with respect to the Z axis. Adjustment of the relative position of the substrate S and the mold PM with respect to the Z axis includes an operation for contact and separation between the imprint material on the substrate S and the mold PM.

The mold driving part MDRV may include a first deforming mechanism ZDM for controlling deformation of the mold PM in the Z axis direction and a second deforming mechanism XYDM for controlling deformation of the mold PM on the XY plane, as well as the above functions. Before the mold PM is made in contact with the imprint material on the substrate S, the first deforming mechanism ZDM controls the mold PM to have a convex shape toward the substrate S. Furthermore, after part of the mold PM is made in contact with the imprint material, the first deforming mechanism ZDM controls deformation of the mold PM such that the mold PM gradually turns from the convex shape to a planar surface shape. The first deforming mechanism ZDM may control deformation of the mold PM in the Z axis direction by controlling the pressure of a space SP on the rear surface side of the mold PM (a space on a side opposite the substrate side). The second deforming mechanism XYDM may deform the mold PM such that the shape of a pattern transfer region of the mold PM matches the shape of a shot region of the substrate S. The pattern transfer region is a region in which a pattern to be transferred to the imprint material on the substrate S is formed.

An adjusting method for an imprint apparatus is performed using a test mold TM in place of the pattern mold PM. Specifically, an adjusting method for the imprint apparatus 100 is performed using the test mold TM which is attached to the mold driving part MDRV. The above explanation for driving of the pattern mold PM by the mold driving part MDRV may be used for driving of the test mold TM by the mold driving part MDRV. In this example, the pattern mold PM is a mold in which a pattern to be transferred to an imprint material on the substrate S is formed. The test mold TM includes a contact region which is in contact with an imprint material supplied on the substrate S. The contact region includes a flat region which does not include a pattern. The contact region may include the same shape and area as those of a pattern transfer region of the pattern mold PM to be used for manufacturing an article. The area of the flat region may be 30% or more of the area of the contact region. In terms of reduction of the manufacturing cost of the test mold TM, it is desirable that the area of the flat region is large. The area of the flat region may be, for example, 40% or more, 50% or more, 60% or more, 70% or more, 80% or more, 90% or more, 95% or more, or 100% of the area of the contact region.

The curing unit 1 supplies energy for curing an imprint material on the substrate S to the imprint material. For example, the curing unit 1 may be configured to supply light as energy for curing an imprint material on the substrate S to the imprint material via the pattern mold PM or the test mold TM. To evaluate or observe a state of contact between the imprint material on the substrate S and the mold PM or TM, the image pickup unit (camera) 2 captures an image formed by the imprint material and the mold PM or TM. The dispenser 3 is an imprint material supply unit which supplies or arranges an imprint material in a non-cured state (liquid state) on the substrate S. The dispenser 3 includes, for example, one or more ejection ports through which an imprint material in the non-cured state is ejected, and controls ejection of the imprint material through the one or more ejection ports in accordance with an arrangement recipe (arrangement pattern) of the imprint material. Normally, the dispenser 3 may arrange the imprint material in the non-cured state on the substrate in such a manner that the imprint material is separated into individual droplets. The arrangement of the imprint material is determined based on the arrangement recipe. For example, a method using heat, a method using a piezoelectric element, or the like is adopted for control of ejection of the imprint material.

The purge gas supply unit 4 supplies purge gas to a space between the substrate S and the mold PM or TM. Purge gas may be used to prompt filling of an imprint material to a concave part configuring a pattern of the mold PM. Gas not inhibiting curing of an imprint material, such as gas including at least one of helium gas, nitrogen gas, and condensable gas (for example, pentafluoropropane (PFP)) may be used as purge gas. The purge gas supply unit 4 may include, for example, a function for controlling or adjusting the injection direction, injection period, injection timing, flow rate, and the like of purge gas. For example, the injection direction of purge gas may be controlled according to from which injection port purge gas is to be injected in the case where the purge gas supply unit 4 includes multiple injection ports having different injection directions of purge gas.

To perform positioning of a shot region of the substrate S and the mold PM, the alignment scope 5 detects the relative position of an alignment mark of the shot region and an alignment mark of the mold PM. The inspection unit 6 inspects a sample prepared for evaluation of a state in which a contact region of the test mold TM is in contact with an imprint material supplied on the substrate S. The inspection unit 6 may include, for example, a microscope for acquiring information (typically, an image) indicating the state of a sample. An off-alignment scope which may be used for, for example, positioning with the substrate holder SH of the substrate S may be used in place of the inspection unit 6. A sample may be any object as long as a state in which the contact region of the test mold TM is in contact with the imprint material supplied on the substrate S may be evaluated. A sample may be prepared by curing an imprint material by the curing unit 1 in a state in which the contact region of the test mold TM is in contact with the imprint material supplied on the substrate S. Alternatively, a sample may be prepared as an imprint material in a state in which the contact region of the test mold TM is in contact with an imprint material supplied on the substrate S and in a non-cured state in which the imprint material is not cured by the curing unit 1. In the latter case, inspection by the inspection unit 6 is performed in a state in which the test mold TM is in contact with the imprint material. In this case, the image pickup unit 2 may be used in place of the inspection unit 6.

To maintain a constant cleanness in the internal space of the chamber 10, the filter 8 may be arranged between the internal space of the chamber 10 and an environment controller (a device which supplies air whose temperature, humidity, and the like are adjusted) arranged in a space outside the chamber 10. The filter 8 may include, for example, a chemical filter for collecting organic materials and a particle filter for collecting inorganic materials such as particles. The performance of the filter 8 degrades with use, and therefore, may be replaced as needed.

The control unit 7 controls the driving unit DRVU, the curing unit 1, the image pickup unit 2, the dispenser 3, the purge gas supply unit 4, the alignment scope 5, and the inspection unit 6, and also processes information supplied from the image pickup unit 2, the alignment scope 5, and the inspection unit 6. The control unit 7 may include, for example, a programmable logic device (PLD) such as a field programmable gate array (FPGA), an application specific integrated circuit (ASIC), a general-purpose computer in which a program is built, or a combination of all or part of the above devices.

An adjusting method for the imprint apparatus 100 will be described below with reference to FIG. 2. The adjusting method illustrated in FIG. 2 may be controlled by the control unit 7. Processing of steps S206 and S209 may be performed through intervention of an engineer (human being) or may be performed mainly by an engineer.

In step S201, the test mold TM is loaded into the chamber 10 of the imprint apparatus 100, and is attached to the mold holder of the mold driving part MDRV. In step S202, the substrate S is loaded into the chamber 10 of the imprint apparatus 100, and is placed on the substrate holder SH.

In step S203, an imprint material in the non-cured state is supplied or arranged on the substrate S by the dispenser 3. In step S204, the driving unit DRVU adjusts the relative position of the substrate S and the test mold TM such that the contact region of the test mold TM is made in contact with the imprint material on the substrate S. Concurrently with the adjustment of the relative position, the shape of the test mold TM in the Z axis direction is controlled by the first deforming mechanism ZDM of the mold driving part MDRV. Specifically, before the test mold TM is made in contact with the imprint material on the substrate S, the first deforming mechanism ZDM controls the test mold TM to have a convex shape toward the substrate S. Furthermore, after part of the test mold TM is made in contact with the imprint material, the first deforming mechanism ZDM may control deformation of the test mold TM such that the test mold TM gradually turns from the convex shape to a planar surface shape. Furthermore, at a desired time before start of the processing of step S204, the purge gas supply unit 4 may start supply of purge gas to a space between the substrate S and the test mold TM.

In step S205, at a time when a set time has passed since the test mold TM was made in contact with the imprint material on the substrate S, the curing unit 1 supplies energy for curing to the imprint material, and the imprint material is thus cured. Furthermore, in step S205, after that, the cured imprint material is separated from the test mold TM. Accordingly, a sample for evaluating the state in which the contact region of the test mold TM is in contact with the imprint material supplied on the substrate S is prepared or formed. As described above, the sample may be prepared as an imprint material in a non-cured state which is not cured by the curing unit 1. In this case, step S205 is not performed before evaluation performed in step S206. After the evaluation performed in step S206, the processing of step S205 may be performed in order to avoid displacement of the imprint material. In an implementation form in which a cured imprint material is prepared as a sample, steps S203, S204, and S205 are sample preparation steps. In an implementation form in which a non-cured imprint material is prepared as a sample, steps S203 and S204 are sample preparation steps. Multiple samples may be prepared for different regions (for example, shot regions) on the substrate S. In this case, multiple samples may be formed while imprint conditions being changed.

In step S206 (evaluation step), the control unit 7 evaluates the prepared sample using the inspection unit 6. As described above, in the implementation form in which a non-cured imprint material is prepared as a sample, the image pickup unit 2 may be used in place of the inspection unit 6. Hereinafter, however, a case where evaluation is performed using the inspection unit 6 will be described representatively. For example, the inspection unit 6 captures an image of a sample while irradiating the sample with illumination light. In the case where the sample has a defect, illumination light is scattered by the defect, and scattered light is generated. As a result, the image captured by the inspection unit 6 provides information indicating the position and size of the defect. The control unit 7 evaluates the sample by processing the image provided by the inspection unit 6. The inspection unit 6 and a processor which processes the information obtained by the inspection unit 6 may be arranged outside the imprint apparatus 100. A defect of a sample may include a void (a cavity in which no imprint material is present). A defect of a sample may include a defect generated when a component (for example, the dispenser 3) of the imprint apparatus 100 is contaminated by a chemical substance. A defect of a sample may include a defect generated by a particle.

For example, by comparing each value of a plurality of pixels of the image of a defect part provided by the inspection unit 6 with a threshold or comparing the image provided by the inspection unit 6 with a reference image prepared in advance, the control unit 7 may extract the defect part. As a method for preparing a reference image, for example, a method may be adopted in which images of multiple samples are captured and an image corresponding to a sample for which it is determined, by inspection with a different inspection device, that no defect exists is defined as a reference image. In the case where a flaw exists in the contact region of the test mold TM, a reference image may be generated based on an image obtained by capturing an image of the contact region.

For example, the control unit 7 may perform evaluation using the number of defects and the dimensions of defects as evaluation items. For example, in the case where the number of defects is less than or equal to a reference value and the size of defects is less than or equal to reference dimensions, the sample as an evaluation target is evaluated as acceptable, and in the case where the number of defects is more than the reference value or the size of defects is more than the reference dimensions, the sample as an evaluation target is evaluated as unacceptable. Evaluation may be performed by the control unit 7, performed through intervention of an engineer (human being), or performed mainly by an engineer.

When it is determined in step S207 that the evaluation target is acceptable in accordance with the evaluation performed in step S206, the control unit 7 proceeds to step S208. When it is determined in step S207 that the evaluation target is unacceptable, the control unit 7 proceeds to step S209. In step S208, the test mold TM and the substrate S are unloaded.

In step S209 (adjustment step), the control unit 7 adjusts (changes) imprint conditions. Specifically, in step S209, the control unit 7 sets new imprint conditions, and performs the processing of steps S203 and later steps again under the new conditions. New conditions may be set by changing the current conditions in accordance with a predetermined standard or by analyzing the result of the evaluation in step S206, as described later. The analysis may be performed by the control unit 7, performed through intervention by an engineer (human being), or performed mainly by an engineer. Imprint conditions may be, for example, provided as a value of a control parameter of the imprint apparatus 100. As an example for setting new conditions by changing the current conditions in accordance with a predetermined standard, for example, a value of a parameter for controlling an operation of the imprint apparatus 100 is changed by a constant value.

Adjustment of imprint conditions may include, for example, adjustment of the purge gas supply unit 4 (for example, adjustment of at least one of a direction in which purge gas is injected, a period during which injection is performed, a timing at which injection is performed, and the flow rate of purge gas). Furthermore, adjustment of imprint conditions may include, for example, adjustment of a dispenser (at least one of the arrangement recipe of the imprint material and the amount of ejection of the imprint material per ejection port). Furthermore, adjustment of imprint conditions may include adjustment of a timing for causing an imprint material supplied on a substrate to be cured by the curing unit 1 after a mold is made in contact with the imprint material. Furthermore, adjustment of imprint conditions may include adjustment of a parameter for controlling contact and separation between an imprint material on a substrate and a mold. Furthermore, adjustment of imprint conditions may include adjustment of a parameter for controlling the relative angle between a substrate and a mold.

Alternatively, in step S209, maintenance of the imprint apparatus 100 is performed. Maintenance of the imprint apparatus 100 may include, for example, replacement, repair, cleaning, and the like of a component.

Hereinafter, specific examples of step S206 (evaluation step) and step S209 (adjustment step) will be described. In step S206, tendency of a defect obtained by the inspection unit 6 may be categorized into a tendency illustrated in FIGS. 3A and 3B, a tendency illustrated in FIGS. 4A and 4B or FIG. 5A or 5B, and a tendency illustrated in FIGS. 6A and 6B. FIGS. 3A to 6B illustrate examples of images captured by the inspection unit 6. Black parts represent defect parts. A defect may occur either when the test mold TM is used or when the pattern mold PM is used. Furthermore, occurrence of a defect in the case where the test mold TM is used and occurrence of a defect in the case where the pattern mold PM is used exhibit a high correlation. Conditions under which defects are suppressed to an acceptable level in the case where the test mold TM is used will be defined as reference conditions. In this case, by performing imprinting using the pattern mold PM under conditions obtained by adding a positive or negative offset to the reference conditions, defects may be suppressed to the acceptable level.

Figure 3A:
FIGS. 3A and 3B are diagrams illustrating an example of an image acquired by an inspection unit.
Figure 3B:

FIGS. 3A and 3B illustrate an example of defects which may be conspicuous when there is a lack of adjustment regarding an operation of the imprint apparatus 100, more specifically, when there is a lack of adjustment of a parameter for controlling an operation of the imprint apparatus 100. FIGS. 4A and 4B and FIGS. 5A and 5B illustrate examples of defects which may be conspicuous when the imprint apparatus 100 is contaminated by a chemical substance. FIGS. 6A and 6B illustrate an example of defects which may be conspicuous when there is a particle inside the imprint apparatus 100.

First, defects which may be conspicuous when there is a lack of adjustment regarding an operation of the imprint apparatus 100 will be explained with reference to FIGS. 3A and 3B. FIG. 3A illustrates an example of an image of a sample captured by the inspection unit 6, and FIG. 3B illustrates an example of an image obtained by enlarging a part of the image illustrated in FIG. 3A. Black parts represent voids generated when there is a lack of air evacuation. The density of voids increases outwards in a concentric shape because the center of the test mold TM is first made in contact with the imprint material on the substrate and the contact part then stretches outwards. Voids may be generated for the reasons described below.

A first reason may be that a contact period is not sufficiently long. If the time elapsed since the test mold TM was made in contact with the imprint material on the substrate (this is called a contact period) is not sufficiently long, air between the substrate S and the test mold TM is not discharged completely, and the air may thus remain as voids. In the implementation form in which a cured imprint material is prepared as a sample, the end time of the contact period is a time when curing is performed. In the implementation form in which a non-cured imprint material is prepared as a sample, the end time of the contact period is a time when an image is captured by the inspection unit 6.

In the case where the result of the evaluation in step S206 (evaluation step) indicates that the contact period is not sufficiently long, the contact period may be increased in step S209 (adjustment step). In the implementation form in which a sample is formed by curing an imprint material, it is efficient to set multiple contact periods and form samples for multiple regions on the substrate in accordance with the corresponding contact periods.

A second reason may be that control for deformation of the test mold TM is not proper. The first deforming mechanism ZDM controls deformation of the test mold TM in the Z axis direction by controlling the pressure of the pressure adjustment space SP on the rear side of the test mold TM. Specifically, before the test mold TM is made in contact with the imprint material on the substrate S, the first deforming mechanism ZDM pressurizes the pressure adjustment space SP to control the test mold TM to have a convex shape toward the substrate S. After part of the test mold TM is made in contact with the imprint material, the first deforming mechanism ZDM decompresses the pressure adjustment space SP to control the test mold TM to gradually turn from the convex shape to a planar surface shape. If control for deformation of the test mold TM by the first deforming mechanism ZDM (in other words, control for pressure of the pressure adjustment space SP) is not performed properly, air between the substrate S and the test mold TM is not discharged completely, and the air may thus remain as voids.

In the case where the result of the evaluation in step S206 (evaluation step) indicates that control for deformation of the test mold TM by the first deforming mechanism ZDM is not proper, a value of a parameter for controlling the first deforming mechanism ZDM may be changed in step S209 (adjustment step). In the implementation form in which a sample is formed by curing an imprint material, it is efficient to set multiple parameter values and form samples for multiple regions on the substrate in accordance with the corresponding parameter values.

A third reason may be that control of the purge gas supply unit 4 is not proper. If the value of a parameter for controlling the injection direction, injection period, injection timing, flow rate, or the like of purge gas injected by the purge gas supply unit 4 is not proper, the density of air between the substrate S and the test mold TM increases. Therefore, the air is not discharged completely, and the air may thus remain as voids. It may often be difficult to constantly supply purge gas to the space between the substrate S and the test mold TM. For example, this is because the running cost is high and in a case where an interferometer or the like is used for controlling the position and orientation of the substrate S, purge gas changes the index of refraction of a light path of the interferometer, thereby reducing the measurement accuracy of the interferometer. Therefore, under the requirement that the supply amount of purge gas be reduced as much as possible, the injection direction, injection period, injection timing, flow rate, and the like of purge gas may be set properly.

In the case where the result of the evaluation in step S206 (evaluation step) indicates that the value of a parameter for controlling the purge gas supply unit 4 (for example, the injection direction, the injection period, the injection timing, or the flow rate) is not proper, the value of the parameter may be changed in step S209 (adjustment step). In the implementation form in which a sample is formed by curing an imprint material, it is efficient to set multiple parameter values and form samples for multiple regions on the substrate in accordance with the corresponding parameter values.

A fourth reason may be that control for contact and separation between an imprint material and a mold by the driving unit DRVU is not proper. In the case where the value of a parameter for controlling contact and separation between the imprint material on the substrate S and the test mold TM by the driving unit DRVU is not proper, air between the substrate S and the test mold TM is not discharged completely, and the air may thus remain as voids. The parameter may be, for example, the relative acceleration or speed of the substrate S and the test mold TM at the time when the imprint material and the test mold TM are brought closer to each other by the driving unit DRVU, the distance between the substrate S and the test mold TM at the time when the imprint material is cured, or the like.

In the case where the result of the evaluation in step S206 (evaluation step) indicates that the value of a parameter for controlling the driving unit DRVU is not proper, the value of the parameter may be changed in step S209 (adjustment step). In the implementation form in which a sample is formed by curing an imprint material, it is efficient to set multiple parameter values and form samples for multiple regions on the substrate in accordance with the corresponding parameter values.

A fifth reason may be that control for the relative angle between the substrate S and the test mold TM by the driving unit DRVU is not proper. In this case, air between the substrate S and the test mold TM is not discharged completely, and the air may thus remain as voids. In this case, however, a tendency different from the tendency illustrated in FIGS. 3A and 3B may be obtained according to the relative angle.

Figure 4A:
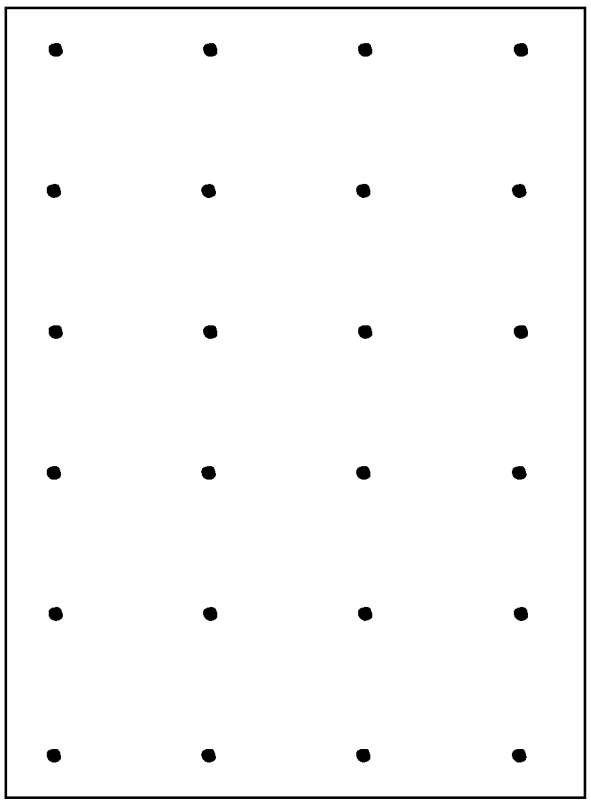
FIGS. 4A and 4B are diagrams illustrating an example of an image acquired by the inspection unit.
Figure 4B:
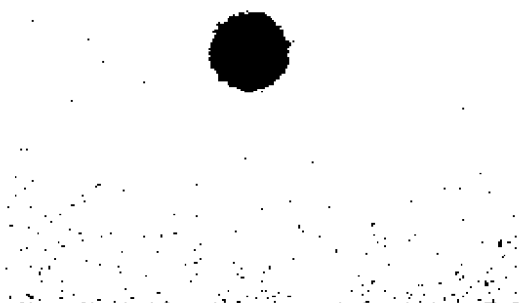

Explanation for defects which may appear when a component of the imprint apparatus 100 is contaminated by a chemical substance will be provided below with reference to FIGS. 4A and 4B. FIG. 4A illustrates an example of an image of a sample captured by the inspection unit 6, and FIG. 4B illustrates an example of an image obtained by enlarging a part of the image illustrated in FIG. 4A. Defects caused by contamination by a chemical substance often appear cyclically, and individual defects often have a shape similar to a circular shape. In the case where images indicating defect positions are analyzed through Fourier transform, the ejection intervals and frequency of an imprint material from an ejection port of the dispenser 3 may match. In the case where the total number of only defects caused by a chemical substance which inhibits formation of a pattern (hereinafter, referred to as chemical contamination defects) is obtained, the method described below is useful. In this method, the rate of the number of chemical contamination defects to the total number of defects detected by the inspection unit 6 may be calculated based on a rate obtained by 1st order and 0th order Fourier peak volumes obtained by Fourier transform analysis. By multiplying the rate by the detected total number of defects, the number of chemical contamination defects may be obtained.

In the case where the above chemical contamination defect occurs, it is assumed that a chemical substance which inhibits filling of an imprint material to the space between the substrate S and the test mold TM exists inside the imprint apparatus 100. It may be considered that the chemical contamination defect occurs due to poor performance of a chemical filter forming the filter 8. In this case, a chemical contamination defect may occur. Therefore, the chemical filter needs to be replaced. In the case where the use period of the chemical filter is shorter than the service life of the chemical filter, a clean room in which the imprint apparatus 100 is installed may need to be inspected.

Figure 5A:
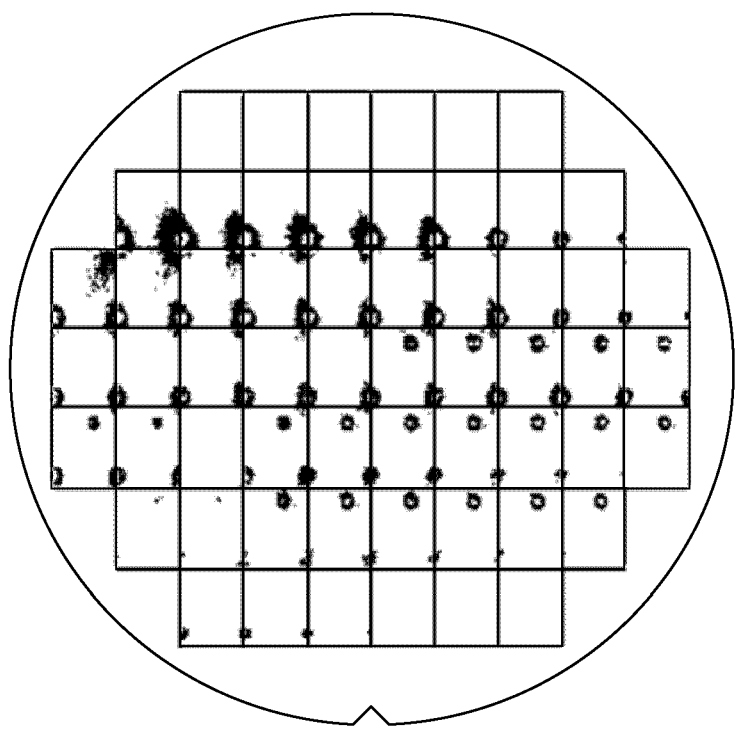
FIGS. 5A and 5B are diagrams illustrating an example of an image acquired by the inspection unit.
Figure 5B:
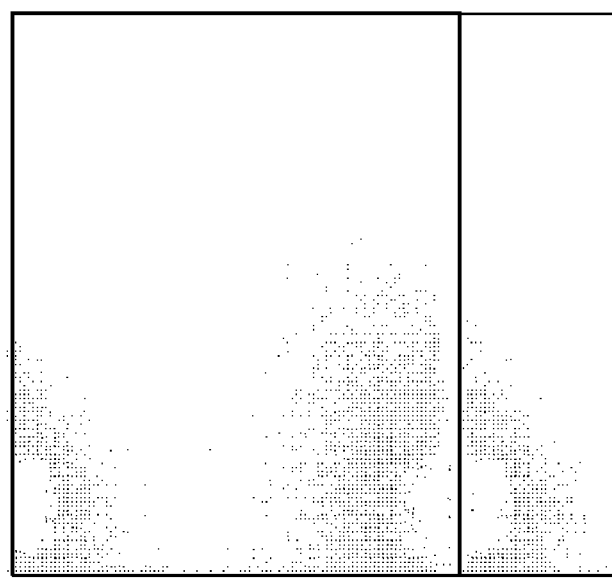
Figure 6A:
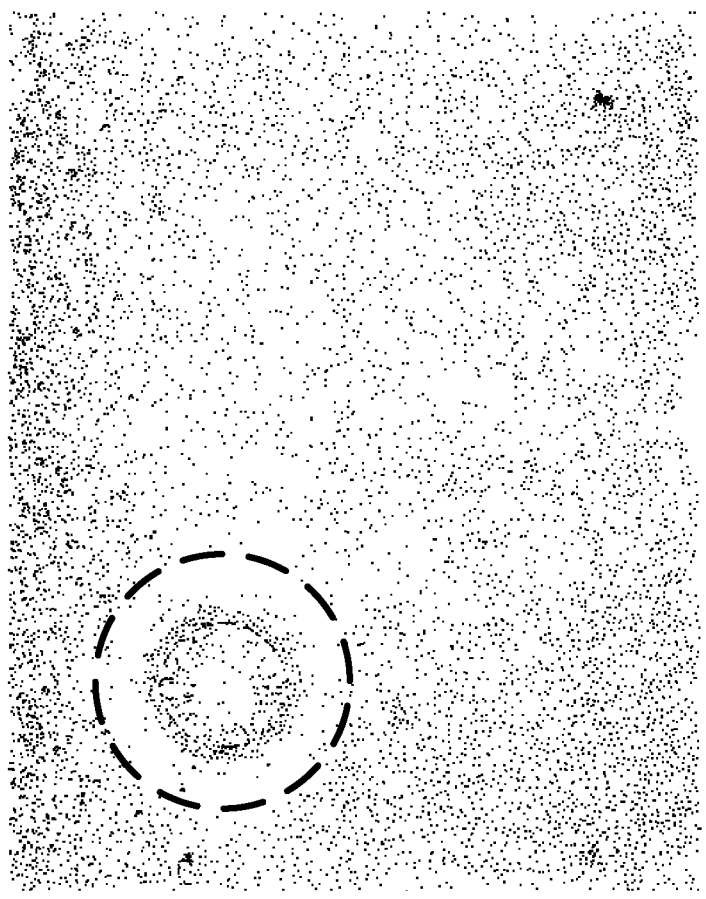
FIGS. 6A and 6B are diagrams illustrating an example of an image acquired by the inspection unit.
Figure 6B:
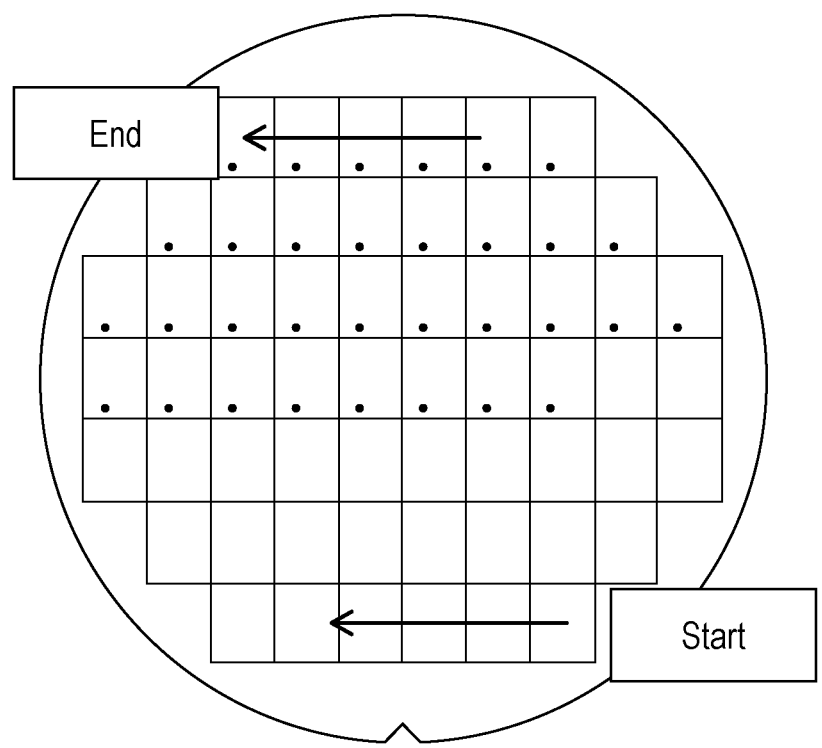

FIG. 5A illustrates an image of a sample captured by the inspection unit 6, the sample being formed over the entire substrate S. FIG. 5B illustrates an example of an image of a shot region as a part of the image illustrated in FIG. 5A. In FIGS. 5A and 5B, each shot region is represented by a rectangle. In the case where a defect distribution is common for all or some of the shot regions of the substrate S and a ripple shape is formed around a certain point, it is highly likely that a chemical substance is attached to the test mold TM. Under such circumstances, if breakthrough of a chemical filter does not occur, a chemical substance may leak out of a component of the imprint apparatus 100. For example, it may be considered that attachment of a chemical substance to the test mold TM may be caused by oil grease used by the driving unit DRVU or a residual organic solvent used by maintenance or cleaning. If such a defect occurs in response to a certain operation, it is necessary to confirm if there is no problem in a solvent or the like used in a previous operation and to eliminate a contamination source.

A defect which is conspicuous when there is a particle such as an inorganic material inside the imprint apparatus 100 will be explained below with reference to FIGS. 6A and 6B. FIGS. 6A and 6B illustrate an example of images of a sample captured by the inspection unit 6. In the case where a sample is formed in a state in which a particle is present between the substrate S and the test mold TM, a defect having a concentric shape centered on the particle may occur, as represented by a part encircled by a broken line in FIG. 6A. In the case where a particle does not have a circular shape, the defect may have a shape according to the shape of the particle. It is assumed that occurrence of a particle may be caused by, for example, dust in the imprint apparatus 100 or intrusion of a particle from outside the imprint apparatus 100. When a defect caused by a particle occurs, the imprint apparatus 100 enters a very dangerous state. For example, in the case where the hardness of the particle is higher than the test mold TM, the test mold TM may be damaged by a single imprinting operation. Thus, it is necessary to identify a cause for the particle and take measures against the cause. For example, if the cause is dust inside the imprint apparatus 100, cleaning, replacement of a component, or the like is required. If the cause is intrusion of a particle from outside the imprint apparatus 100, blocking an intrusion path, making the inner pressure of the chamber 10 positive, or the like is required. Furthermore, it is important to identify a dust source using a method for analyzing the composition of a particle and comparing the composition with materials of components of the imprint apparatus 100, or the like.

FIG. 6B illustrates an example of a result of an inspection for the entire substrate. For continuous imprinting for multiple shot regions of the substrate, in the case where defects occur at the same position in imprinting to shot regions subsequent to a certain shot region, it is suggested that a particle may be attached to the test mold TM. In this case, it may be confirmed that the test mold TM has been damaged, and cleaning for eliminating the particle from the test mold TM may be performed. Furthermore, as described above, a cause for occurrence of the particle may be identified, and measures against the cause may be taken.

As described above, by preparing a sample using a test mold and adjusting the imprint apparatus in accordance with the result of evaluation of the sample, compared to the case where adjustment is performed using a pattern mold, cost for adjusting the imprint apparatus may be reduced. Furthermore, by categorizing evaluation results, a cause for a defect may be identified effectively.

In general, in evaluating a defect occurring in the imprint apparatus, a pattern may be formed on the substrate using a pattern mold for defect inspection. However, defect evaluation using a test mold may cover most of all defect types, excepting defects which are caused by a reason specific to a pattern mold.

Very fine machining is performed on a pattern mold. Therefore, when a particle is present between the substrate and the pattern mold, the pattern may be damaged and may become unusable. Furthermore, by performing imprinting repetitively a certain number of times or more, impact at the time of contact with an imprint material or separation from the cured imprint material may damage the pattern of the pattern mold. In general, the service life of a pattern mold is based on the number of times that imprinting is performed. If the pattern is damaged before imprinting is performed the number of times corresponding to the service life, the lifetime is completed at the point in time. Accordingly, adjusting the imprint apparatus using a low-cost test mold with no risk of damage is very advantageous in terms of cost reduction.

Throughput performance is another performance index of an imprint apparatus. The throughput performance is, for example, the number of substrates which is processed per unit time. In the imprint apparatus, a filling period required for filling of an imprint material to a concave part configuring a pattern of a pattern mold may be a parameter which greatly affects the throughput performance. The filling period corresponds to the contact period described above, which is a time during which the pattern mold is in contact with an imprint material on the substrate before curing. The filling period (contact period) and defects are correlated. A longer filling period achieves a higher filling rate of an imprint material to a concave part configuring a pattern. Therefore, the imprint material easily stretches between the substrate and the mold, and the number of defects is thus reduced. Accordingly, the filling period required for suppressing defects to an acceptable level greatly affects the throughput performance.

Figure 7:
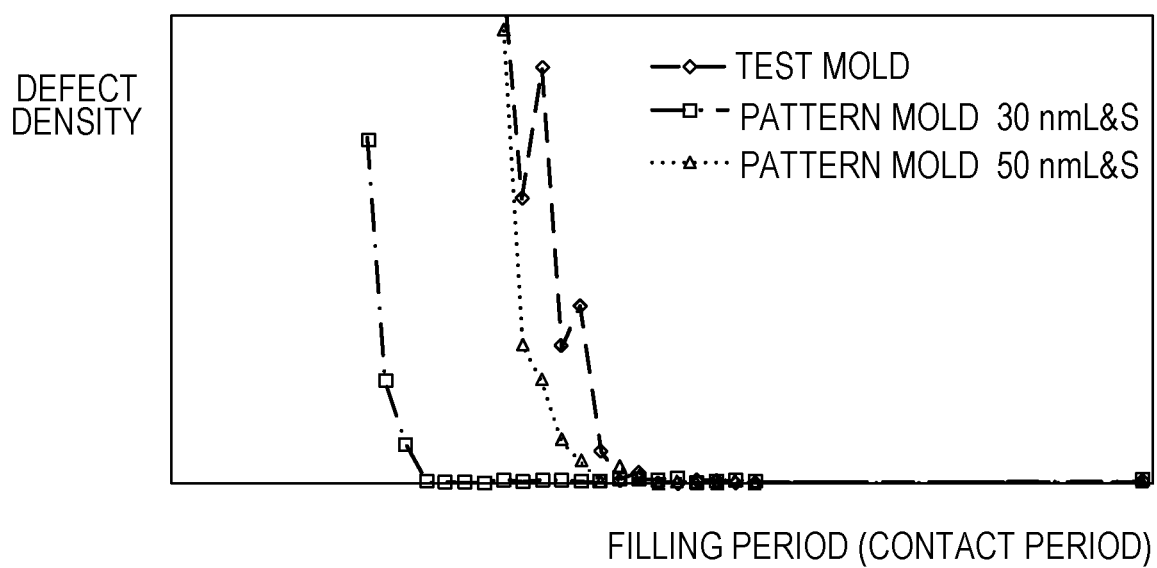
FIG. 7 is a diagram illustrating an example of the relationship between a filling period (contact period) and defect density.

FIG. 7 is a diagram illustrating an example of the relationship between a filling period (contact period) and defect density. The horizontal axis represents the filling period (contact period) and the vertical axis represents the defect density. In FIG. 7, an example of the relationship between the contact period and the defect density in the case where a test mold is used is illustrated. In FIG. 7, an example of the relationship between the filling period (contact period) and the defect density in the case where a pattern mold including a line and space pattern of 30 nanometers is used is also illustrated. Furthermore, in FIG. 7, an example of the relationship between the filling period (contact period) and the defect density in the case where a pattern mold including a line and space pattern of 50 nanometers is used is also illustrated. Evaluations of the cases where the above three molds are used are performed under the same conditions, excepting that different molds are used. The filling period (contact period) corresponding to a defect density of 0 is the shortest filling period (shortest contact period) which may guarantee that no defect may occur.

As is clear from FIG. 7, irrespective of the same conditions, the shortest contact period for the case where the test mold is used is longer than the shortest filling period (shortest contact period) for the case where the pattern mold is used. This indicates that the imprint material does not stretch well between the substrate and the mold in the case where the test mold is used, compared to the case where the pattern mold is used. This is because the presence of a concave part configuring a pattern allows the imprint material to be stretch easily between the substrate and the mold due to a capillary phenomenon, in which the imprint material is attracted to the concave part. The fact that the shortest filling period for the line and space pattern of 30 nanometers is shorter than the shortest filling period for the line and space pattern of 50 nanometers also supports the above reason.

As is clear from FIG. 7, the shortest filling period depends on the density and dimension of a concave part configuring a pattern. Therefore, even in the case where the shortest filling period is determined using the pattern mold for defect inspection, if the density and dimension of a concave part of the pattern mold for manufacturing the actual product are different from the density and dimension of a concave part of the pattern mold for defect inspection, the shortest filling period may not be guaranteed. Therefore, determining the shortest filling period using the test mold in which the capillary phenomenon does not occur is more advantageous to guarantee suppression of defects to the acceptable level.

Evaluation of a defect using the test mold is evaluation of a defect which does not depend on the pattern of the mold, that is, a defect caused only by the imprint apparatus, and is therefore useful for regular performance inspection of the imprint apparatus. Regular performance inspection is important for operating the imprint apparatus. Therefore, taking into consideration operation over a long period of time, using a test mold instead of an expensive pattern mold, which is easily damaged and may also cause a defect not arising from the imprint apparatus, is advantageous in terms of reduction of running cost.

Furthermore, for adjustment of an imprint apparatus using a test mold, a simple sample is prepared for the adjustment. Therefore, such adjustment is advantageous in that an expensive inspection unit may not be adopted as the inspection unit 6.

In addition, evaluation of a defect using a test mold is advantageous for determining, in the case where the result of imprinting is unstable, whether the unstable result is caused by an imprint apparatus or a different reason (for example, matching between a process and a pattern, etc.). For example, in the case where the space or relative angle between a substrate and a mold, supply conditions of purge gas, or the like slightly changes, the slight change may be understood quickly by managing the state of the imprint apparatus using the test mold.

The evaluation in step S206 (evaluation step) described above is evaluation of the state of an imprint material in a flat region as a contact region of the test mold TM (hereinafter, referred to as a first evaluation). Then, in step S209 (adjustment step), the imprint apparatus 100 is adjusted based on the result of the first evaluation. However, the entire contact region of the test mold TM may not be formed as a flat region. The contact region may include a mark region in which an alignment mark is arranged, as well as the flat region. In this case, the evaluation in step S206 (evaluation step) described above may further include evaluation of the alignment performance by detecting the alignment mark of the contact region (hereinafter, referred to as a second evaluation). Then, in step S209 (adjustment step), the imprint apparatus 100 may be adjusted based on the first evaluation and the second evaluation. The alignment mark provided in the contact region of the test mold TM may be detected by the alignment scope 5 at the time of alignment between the substrate S and the test mold TM. Specifically, the relative position of the alignment mark of the test mold TM and the alignment mark of the substrate S may be detected by the alignment scope 5, and alignment of the shot region of the substrate S and the test mold TM may be performed based on the detected relative position. The alignment performance is, for example, performance regarding the accuracy of alignment between the shot region of the substrate S and the mold TM (PM). The alignment performance may be evaluated by inspection of a sample by the inspection unit 6, the sample being prepared using the test mold TM. Specifically, the relative position of the original alignment mark at the substrate S and an alignment mark transferred by the test mold TM may be inspected by the inspection unit 6.

By providing an alignment mark in the contact region of the test mold TM, the first evaluation and the second evaluation may be performed at the same time. Accordingly, for example, the time required for maintenance of the imprint apparatus 100 may be shortened.

With the use of the imprint apparatus 100 which has been adjusted by the adjusting method described above, an imprinting method for manufacturing an article is performed. In the imprinting method, first, an imprint material in a non-cured state is supplied or arranged on the substrate S by the dispenser 3. Then, the driving unit DRVU adjusts the relative position of the substrate S and the pattern mold PM such that the pattern mold PM is in contact with the imprint material on the substrate S. Concurrently with the adjustment of the relative position, the first deforming mechanism ZDM of the mold driving part MDRV controls the shape of the pattern mold PM in the Z axis direction. Specifically, before the pattern mold PM is made in contact with the imprint material on the substrate S, the first deforming mechanism ZDM controls the pattern mold PM to have a convex space toward the substrate S. After part of the pattern mold PM is made in contact with the imprint material, the first deforming mechanism ZDM controls deformation of the pattern mold PM such that the pattern mold PM gradually turns from the convex shape to a planar surface shape. Furthermore, in a desired time before the pattern mold PM is made in contact with the imprint material on the substrate S, the purge gas supply unit 4 may start supply of purge gas to a space between the substrate S and the pattern mold PM. Then, when a set time has passed since the pattern mold PM was made in contact with the imprint material on the substrate S, the curing unit 1 supplies energy for curing to the imprint material, and the imprint material is thus cured. Then, the cured imprint material is separated from the pattern mold PM. Accordingly, the pattern of the pattern mold PM is transferred to the imprint material supplied on the substrate S.

Figure 8:
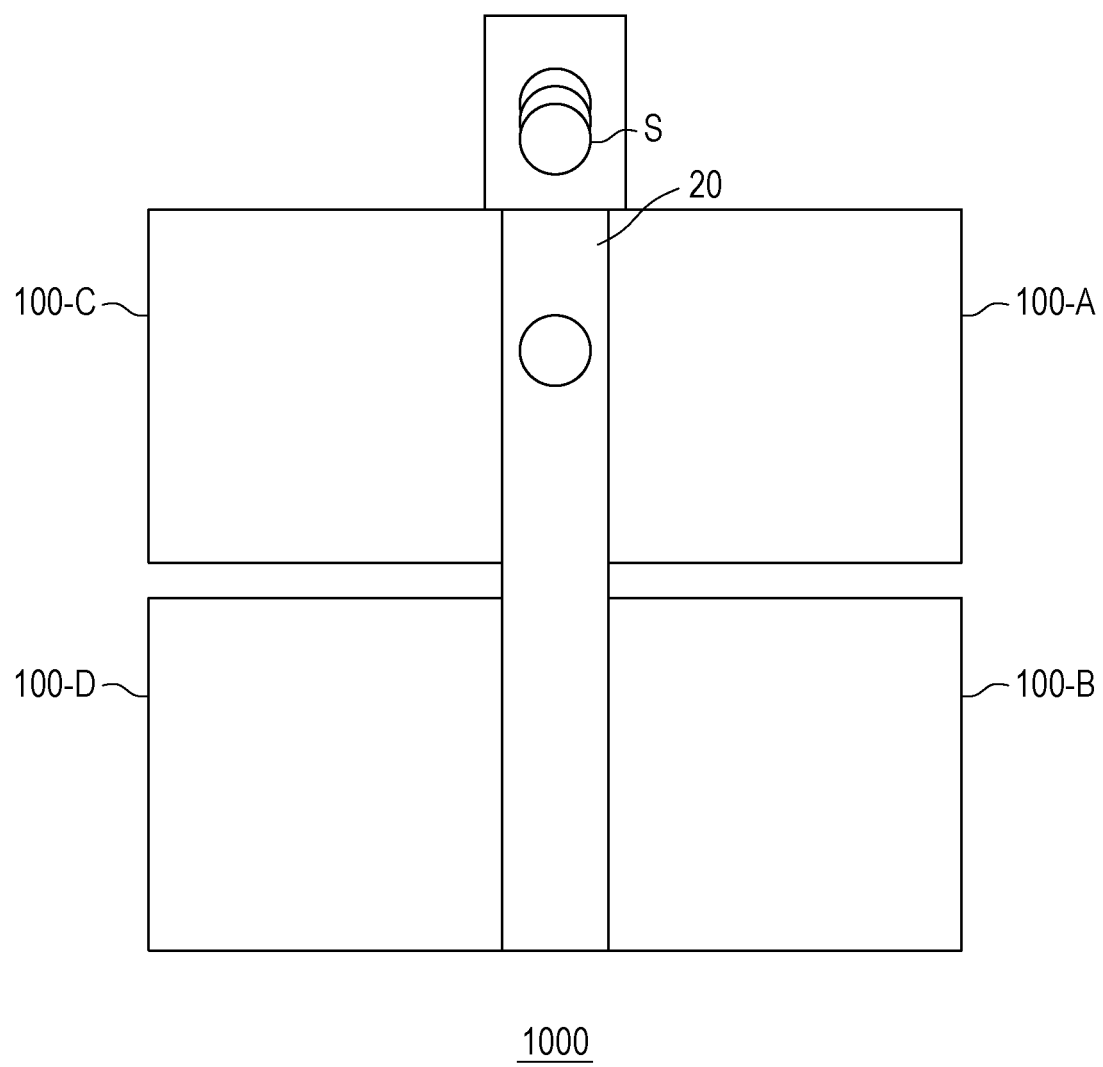
FIG. 8 is a diagram schematically illustrating a configuration of an imprint system as an application example.

FIG. 8 illustrates an example of a configuration of an imprint system 1000 as an application example. The imprint system 1000 includes multiple imprint apparatuses 100. In this example, to distinguish the multiple imprint apparatuses 100 from one another, signs 100-A, 100-B, 100-C, and 100-D are allocated to the imprint apparatuses 100. The imprint system 1000 includes a transport mechanism 20 which is shared among the imprint apparatuses 100-A, 100-B, 100-C, and 100-D. In addition, an energy source (for example, a light source) of the curing unit 1 may be shared among the imprint apparatuses 100-A, 100-B, 100-C, and 100-D.

Figure 9:
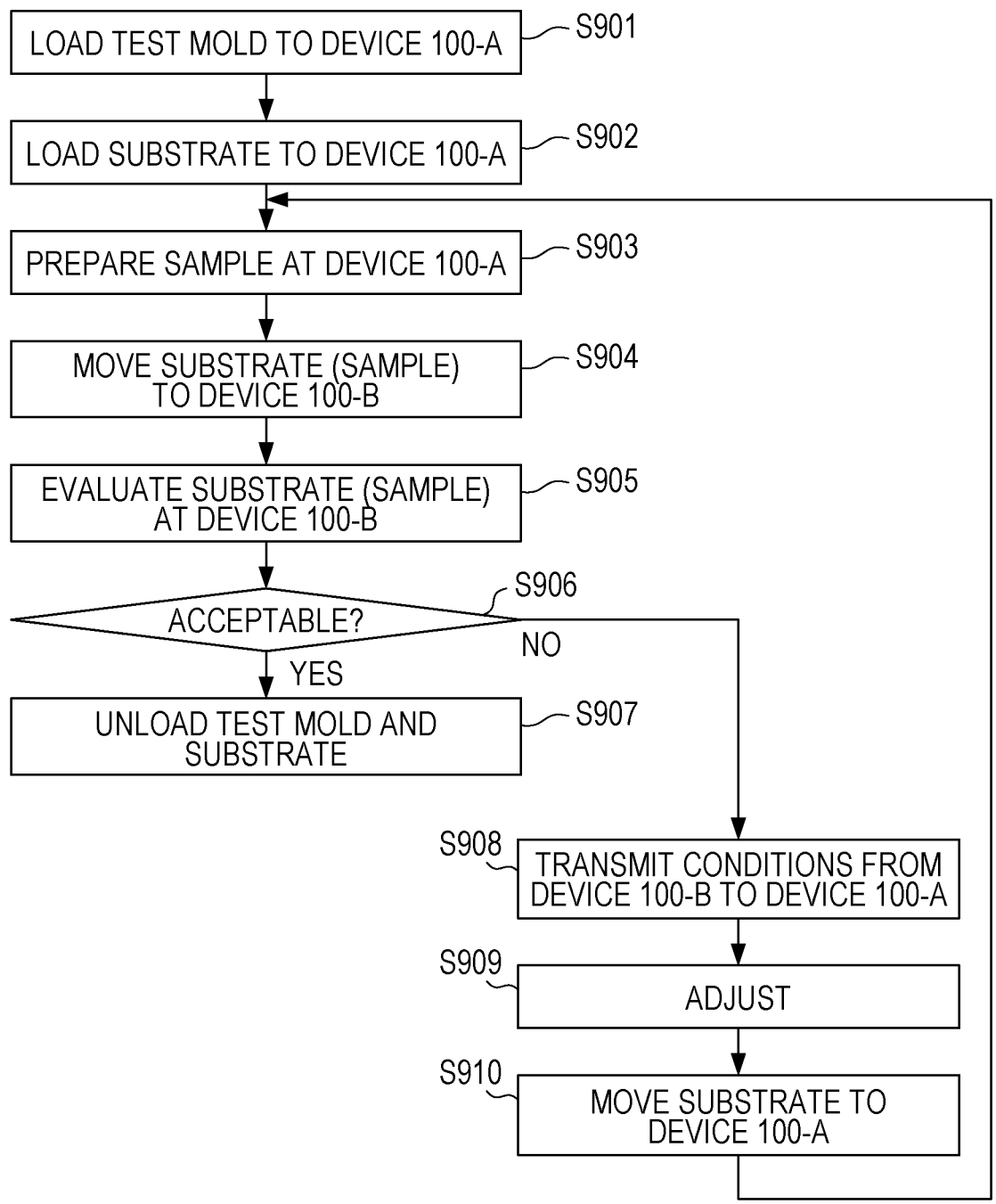
FIG. 9 is a diagram illustrating an example of an adjusting method for an imprint apparatus in an imprint system.

FIG. 9 illustrates an example of an adjusting method for the imprint apparatus 100-A in the imprint system 1000. In step S901, the test mold TM is loaded into the chamber 10 of the imprint apparatus 100-A, and is attached to the mold holder of the mold driving part MDRV. In step S902, the substrate S is loaded into the chamber 10 of the imprint apparatus 100-A, and is placed on the substrate holder SH. In step S903 (preparation step), a sample is formed at the imprint apparatus 100-A in accordance with the processing of steps S203 to S205 in FIG. 2. In step S904, the transport mechanism 20 transports the sample from the imprint apparatus 100-A to the imprint apparatus 100-B. In step S904 (evaluation step), the sample is evaluated by the inspection unit 6 at the imprint apparatus 100-B, as in step S206 of FIG. 2. While the sample is being evaluated at the imprint apparatus 100-B, a sample may be formed for a different substrate at the imprint apparatus 100-A. In step S906, if the result of evaluation in step S905 indicates that the sample is acceptable, the process proceeds to step S907. If the result indicates that the sample is unacceptable, the process proceeds to step S908. In step S907, the test mold TM and the substrate S are unloaded. In step S908, the result of evaluation in step S905 is transferred from the imprint apparatus 100-B to the imprint apparatus 100-A. In step S909 (adjustment step), conditions for imprinting in the imprint apparatus 100-A are adjusted (changed), as in step S209 of FIG. 2. In step S910, the transport mechanism 20 transports the substrate (sample) from the imprint apparatus 100-B to the imprint apparatus 100-A. Then, under new conditions, the processing from step S903 is performed again.

Now, an article manufacturing method for manufacturing an article using the imprint apparatus 100 will be described below. An article may be, for example, a semiconductor integrated circuit element, a liquid crystal display element, or the like. The article manufacturing method includes a step of forming a pattern on a substrate (a wafer, glass plate, or file-like substrate) using the imprint apparatus 100 which has been adjusted by the adjusting method described above. Furthermore, the manufacturing method may include a step of processing (for example, etching) the substrate on which the pattern is formed. In the case where other articles such as patterned media (recording media) or an optical element are manufactured, the manufacturing method may include processing for machining the substrate on which the pattern is formed, instead of etching. The article manufacturing method according to an embodiment is advantageous in at least one of the performance, quality, productivity, and production cost of an article, compared to conventional methods.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-254871, filed Dec. 25, 2015, which is hereby incorporated by reference herein in its entirety.

What is claimed is:

1. A method of controlling an imprint apparatus that forms a pattern on a substrate by contacting a mold with an imprint material on the substrate, the imprint apparatus comprising a driving unit configured to drive at least one of a substrate holder and a mold holder so as to bring a mold held by the mold holder into contact with the imprint material on the substrate and an image capturing unit configured to capture an image, the method comprising:
   controlling the driving unit so that an adjustment surface of a test mold held by the mold holder comes into contact with an imprint material on a test substrate, the adjustment surface being a flat region without a pattern thereon of the contact region;
   capturing an image of the imprint material that is in contact with the adjustment surface of the test mold by the image capturing unit; and
   controlling to output information based on the image captured by the image capturing unit,
   wherein the information is used to adjust imprint conditions of the imprint apparatus used for forming a pattern on the substrate using the mold having a pattern structure and different from the test mold.

2. The method according to claim 1, further comprising controlling a curing unit to cure the imprint material that is in contact with the adjustment surface of the test mold before capturing the image.

3. The method according to claim 1,
   wherein the test mold further includes an alignment mark arranged on a mark region thereof,
   wherein the information further includes an evaluation of alignment performance by detecting the alignment mark.

4. The method according to claim 1, wherein the step of controlling the image capturing unit is performed in a state where the adjustment surface of the test mold is in contact with the imprint material in a non-cured state on the test substrate.

5. The method according to claim 1, wherein the flat region is 30% or more of the contact region of the test mold.

6. The method according to claim 1,
   wherein the imprint apparatus includes a purge gas supply unit configured to supply purge gas between the substrate and the mold, and
   wherein the information is used for adjustment of the purge gas supply unit.

7. The method according to claim 1,
   wherein the imprint apparatus includes an imprint material supply unit configured to supply the imprint material on the substrate, and
   wherein the information is used for adjustment of the imprint material supply unit.

8. The method according to claim 1, wherein the information is used for adjustment of a time for curing the imprint material after the mold is in contact with the imprint material supplied on the substrate.

9. The method according to claim 1, wherein the information is used for adjustment of a parameter for controlling contact and separation between the imprint material on the substrate and the mold.

10. The method according to claim 1, wherein the information is used for adjustment of a relative angle between the substrate and the mold.

11. The method according to claim 1, further comprising:
   adjusting the imprint conditions of the imprint apparatus based on the information; and
   forming a pattern of an imprint material on a substrate using the mold having a pattern structure and different from the test mold by the imprint apparatus which has been adjusted.

12. The method according to claim 1, wherein the information is output by comparing each value of a plurality of pixels of the captured image with a threshold value.

13. The method according to claim 1, wherein the information is output by comparing the captured image with a reference image prepared in advance.

14. The method according to claim 1, wherein the information includes at least one of a position and a size of a defect.

15. The method according to claim 14, wherein the defect includes a void.

16. The method according to claim 14, wherein the defect includes a defect caused by contamination by a chemical substance.

17. The method according to claim 14, wherein the defect includes a defect caused by a particle.

18. An article manufacturing method comprising:
   a step of acquiring the information by the method according to claim 1;
   a step of adjusting the imprint conditions of the imprint apparatus based on the information;
   a step of forming a pattern on a substrate using the mold having a pattern structure and different from the test mold by the imprint apparatus which has been adjusted, and
   a step of forming the article by processing the substrate on which the pattern is formed.

19. The article manufacturing method according to claim 18, wherein the step of adjusting imprint conditions is performed by a human.

20. The article manufacturing method according to claim 18, wherein the step of adjusting imprint conditions is performed by the control unit of the imprint apparatus.

21. A method of controlling an apparatus that contacts a mold with a resin material on a substrate, the apparatus comprising a driving unit configured to drive at least one of a substrate holder and a mold holder so as to bring a mold held by the mold holder into contact with the resin material on the substrate and an image capturing unit configured to capture an image, the method comprising:

controlling the driving unit so that an adjustment surface of a test mold held by the mold holder comes into contact with a resin material on a test substrate held by the substrate holder, the adjustment surface is a flat region without a pattern of the test mold;

controlling the image capturing unit to capture an image including a region of the resin material on the test substrate which the adjustment surface of the test mold is in contact with or separated from; and controlling to output information based on the image captured by the image capturing unit for adjusting the apparatus, wherein the information is used to adjust apparatus conditions of the apparatus used for forming a layer on the substrate by the resin material using the mold having a pattern structure and different from the test mold.

* * * * *